United States Patent [19]

Seibold et al.

[11] Patent Number: 5,142,441

[45] Date of Patent: Aug. 25, 1992

[54] CIRCUIT BOARD WITH COOLING DEVICE

[75] Inventors: Gerhard Seibold, Remseck; Stauros Smernos, Stuttgart; Matjaz Florjancic, Murr; Otto Thaidigsmann, Stuttgart; Horst Richter, Böblingen, all of Fed. Rep. of Germany

[73] Assignee: Alcatel N.V., Amsterdam, Netherlands

[21] Appl. No.: 314,079

[22] Filed: Feb. 23, 1989

[30] Foreign Application Priority Data

Feb. 25, 1988 [DE] Fed. Rep. of Germany ....... 3805851

[51] Int. Cl.$^5$ .............................................. H05K 7/20
[52] U.S. Cl. .................................. 361/382; 361/414; 174/252
[58] Field of Search ..................... 361/382-388, 361/412, 414; 165/185; 174/68.5, 15.1, 15.2, 16.1, 252, 259

[56] References Cited

U.S. PATENT DOCUMENTS

| 4,547,834 | 10/1985 | Dumont | 361/386 |
|---|---|---|---|
| 4,587,594 | 5/1986 | McPherson | 361/383 |
| 4,631,636 | 12/1986 | Andrews | 361/385 |
| 4,718,163 | 1/1988 | Berland et al. | 361/382 |
| 4,729,061 | 3/1988 | Brown | 361/414 |
| 4,734,315 | 3/1988 | Spence-Bate | 174/16.1 |
| 4,739,443 | 4/1988 | Singhdeo | 361/385 |

FOREIGN PATENT DOCUMENTS

| 0083538 | 12/1982 | European Pat. Off. |
|---|---|---|
| 1930642 | 1/1971 | Fed. Rep. of Germany . |
| 2536361 | 2/1976 | Fed. Rep. of Germany . |
| 2550419 | 5/1976 | Fed. Rep. of Germany . |
| 3011744 | 3/1981 | Fed. Rep. of Germany . |
| 3601140 | 7/1987 | Fed. Rep. of Germany . |
| 2800080 | 10/1987 | Fed. Rep. of Germany . |
| 1105068 | 3/1968 | United Kingdom ................ 361/414 |

OTHER PUBLICATIONS

D. R. Barbour, S. Oktay & R. A. Rinne, "Thermal-Condition Module Cradles and Cools Up to 133 LSI Chips", Jun. 16, 1982, pp. 143-146.

Primary Examiner—Gerald P. Tolin
Attorney, Agent, or Firm—Spencer, Frank & Schneider

[57] ABSTRACT

A circuit board with a cooling device having channels through which a cooling agent flows, the circuit board being comprised of at least three united layers including an inner layer wherein the channels are formed.

10 Claims, 1 Drawing Sheet

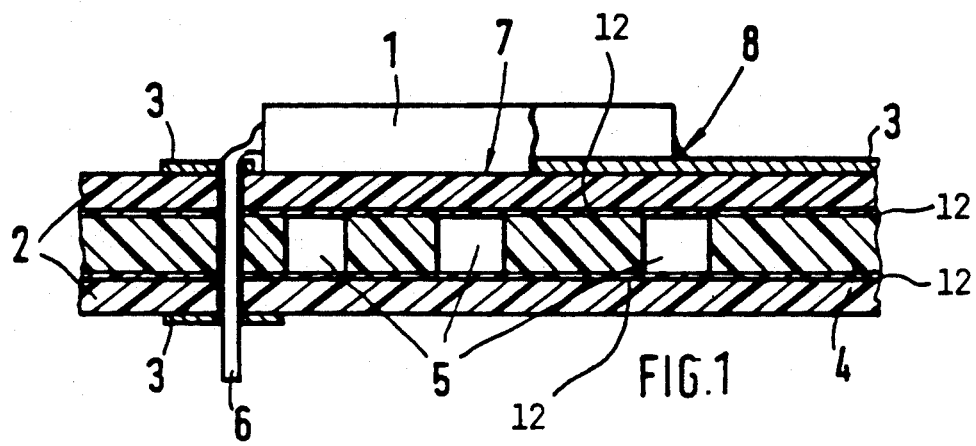
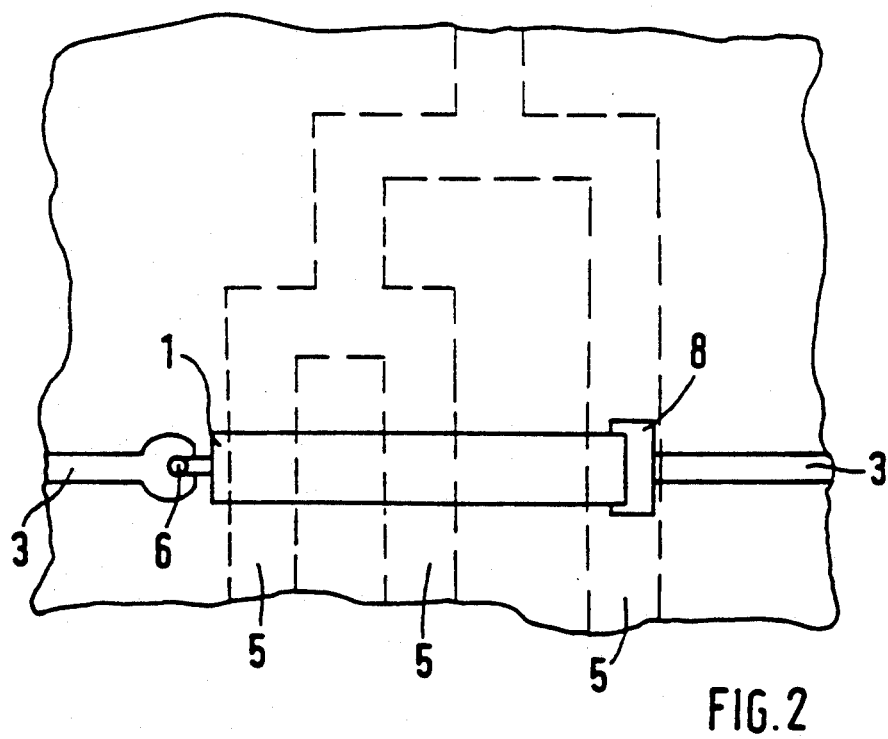

CIRCUIT BOARD WITH COOLING DEVICE

BACKGROUND OF THE INVENTION

The present invention relates to a circuit board with a cooling device having channels through which a cooling agent flows.

Dissipation per unit area or unit volume increases with increasing component density in semiconductor integrated circuits. The heat produced must be effectively removed by being transferred, for example, through the leads or via the contact area of the component to the circuit board, distributed on the latter and carried away. The heat removal must be fast enough to prevent the formation of overheated spots, which, in the worst case, may result in a failure of the semiconductor components. In the case of circuit boards with high component density, i.e., circuits in which much heat is generated, such a distribution and removal of the heat produced is no longer sufficient, so such circuit boards must be provided with an additional cooling device.

A prior-art cooling device described in European Patent Application No. 0,083,538-B1 consists of a hollow copper plate provided with internal partitions which form the cooling channels. Bonded to one or both surfaces of the hollow copper plate is a circuit board to which the semiconductor components are soldered either directly or via leads.

To form the hollow copper plate, a model of wax or any other low-melting material is produced in which the copper partitions are embedded or holes are made for passing the leads therethrough. The entire surface of the model is then coated with copper by an electrolytic process. The copper coating is subsequently removed at two lateral opposed faces by machining. Finally, the wax or the like is removed by dissolution, thus leaving hollow spaces serving as cooling channels. The production of the hollow copper plates is thus very complicated and costly and no especially suited for volume production.

SUMMARY OF THE INVENTION

It is therefore an object of the present invention to provide a circuit board which is easy to manufacture and which, even if very densely loaded with components, effectively carries away the heat produced.

According to the invention, this object is attained by a circuit board which is composed of at least three united layers, including an inner layer having cooling channels formed therein.

The layers forming the circuit board are preferably united by an adhesive or by means of adhesive films. They are then permanently united under pressure and/or heat.

The fact that the cooling device according to the invention forms part of the circuit board offers a number of advantages. The cooling channels can readily be arranged to run directly below the semiconductor components. The heat can thus be removed directly and effectively where it is produced. The circuit board retains its dimensions because no additional space is required for a cooling device. The circuit board also can readily be provided with through-holes for mounting components having leads. The materials needed to manufacture the circuit board according to the invention include a nonconducting base material, such as glass-fiber-reinforced epoxy resins of the type FR4, and the necessary apparatus such as compression molds, are used in the manufacture of so-called multilayer circuit boards anyhow so the manufacture of circuit boards cooled in accordance with the invention requires no additional materials or equipment whatever. The cooling channels can be prepared simply by milling, stamping, or cutting the inner layer of the circuit board.

BRIEF DESCRIPTION OF THE DRAWINGS

FIG. 1 is a cross-sectional view of a circuit board according to the invention, and FIG. 2 is a top view of the circuit board of FIG. 1.

DETAILED DESCRIPTION OF PREFERRED EMBODIMENTS

On the circuit board, which is shown in a partial cross-sectional view in FIG. 1, a semiconductor component 1 is mounted. The circuit board itself consists of two outlet nonconducting layers (cover layers) 2, on which copper conductors 3 are deposited, and an inner nonconducting layer (or spacing layer) 4. Together the two outer layers 2 and the inner layer 4 form a nonconducting substrate for conductors 3 of the circuit board. These layers 2 and 4 are united by an adhesive or adhesive layers 12.

In the inner layer 4, slots or recesses are formed by milling, stamping, or cutting. In conjunction with the two outer layers 2, they form channels 5, through which a cooling agent, e.g., a cooling fluid, flows, which effectively carries away the heat generated within the semiconductor component.

In the top view (FIG. 2), he channels 5 are shown by broken lines. They can be single continuous channels (cf. right-hand side) or divergent channels (cf. left-hand side), depending on the thermal conditions and the design of the circuit board.

The component 1 is provided on its left-hand side with leads 6 which are passes through and soldered to the circuit board. The component 1 rests on the outer layer 2 with a large contact area 7, so that optimum heat transfer is ensured.

On the right-hand side in FIG. 1, the component 1 is shown as a surface-mounted component, which is connected with the conductors 3 via a connection 8 having no lead. The two types of connection are shown here on a single component only for ease of illustration. Normally, a component will be connected to the conductors of the circuit board either with or without leads.

In the illustrated embodiment, the outer layers 2 and the inner layer 4 are united by adhesive 12. If necessary, the setting of the adhesive layer may be accelerated by the addition of heat. The layers 2 and 4 may also be united to the inner layer 4 by means of a prepreg. A prepreg is a glass-fiber-reinforced adhesive film of grafted synthetic resin. The synthetic resin, either polyester or epoxy, is polymerized and cured by compression molding to obtain a perfect joint between the layers.

We claim:

1. A circuit board for electrical components comprising a nonconducting substrate having conductor paths on at least one outer surface thereof and wherein:

said substrate comprises two electrically nonconducting outer layers and an electrically nonconducting inner layer disposed between said outer layers and having channels through which a cooling agent may flow; said inner and outer layers of said substrate are joined by an adhesive; and said conductor paths are disposed on an outer surface of at least one of said outer layers.

2. A circuit board as defined in claim 1, wherein said adhesive comprises respective adhesive films.

3. A circuit board as defined in claim 2, wherein said adhesive films comprise a polymerized synthetic resin.

4. A circuit board as defined in claim 1, wherein said channels expose both said outer layers to the cooling agent which flows through said channels.

5. A circuit board as defined in claim 1, wherein said channels in said inner layer are closed by joining said two outer layers to said inner layer.

6. A circuit board as defined in claim 1, wherein said channels extend vertically completely through said inner layer.

7. A circuit board as defined in claim 1, wherein conductor paths are disposed on a respective outer surface of each of said outer layers.

8. A circuit board as defined in claim 1, wherein said channels extend to at least an associated outer surface of said inner layer.

9. A circuit board as claimed in claim 1 wherein said channels are constituted by slots provided in said inner layer.

10. A circuit board as claimed in claim 1 wherein said channels are constituted by recesses provided in said inner layer.

* * * * *